United States Patent
Shin

(10) Patent No.: US 8,653,511 B2
(45) Date of Patent: Feb. 18, 2014

(54) ORGANIC LIGHT EMITTING DIODE DISPLAY

(75) Inventor: Hyea-Weon Shin, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/186,273

(22) Filed: Jul. 19, 2011

(65) Prior Publication Data

US 2012/0097927 A1 Apr. 26, 2012

(30) Foreign Application Priority Data

Oct. 22, 2010 (KR) .......................... 10-2010-0103550

(51) Int. Cl.
*H01L 29/08* (2006.01)

(52) U.S. Cl.
USPC ..................................... 257/40; 257/E51.018

(58) Field of Classification Search
USPC ............................................ 257/40, E51.018
See application file for complete search history.

(56) References Cited

U.S. PATENT DOCUMENTS

| | | | |
|---|---|---|---|
| 7,307,381 B2 * | 12/2007 | Ito et al. ........................ | 313/506 |
| 7,815,479 B2 * | 10/2010 | Koo et al. ....................... | 445/24 |
| 7,993,960 B2 * | 8/2011 | Mathea et al. .................. | 438/99 |
| 2007/0052352 A1 * | 3/2007 | Im et al. ........................ | 313/506 |
| 2008/0143251 A1 * | 6/2008 | Mathea et al. ................. | 313/504 |
| 2009/0174320 A1 * | 7/2009 | Kim ............................... | 313/504 |
| 2010/0045173 A1 * | 2/2010 | Kwon et al. ................... | 313/504 |

FOREIGN PATENT DOCUMENTS

| | | |
|---|---|---|
| JP | 2001-126867 | 5/2001 |
| JP | 2009-238456 | 10/2009 |
| JP | 2009-251486 | 10/2009 |
| KR | 10-2009-0106566 | 10/2009 |

* cited by examiner

*Primary Examiner* — Kimberly Rizkallah
*Assistant Examiner* — Caleb Henry
(74) *Attorney, Agent, or Firm* — Robert E. Bushnell, Esq.

(57) ABSTRACT

An organic light emitting diode (OLED) display may be constructed with a substrate; a first electrode formed on the substrate; a barrier rib formed on the substrate and having an opening exposing the first electrode; an organic emission layer formed on the first electrode; and a second electrode formed on the organic emission layer. The barrier rib includes an isolating groove formed between organic emission layers of neighboring pixels. Accordingly, in the organic light emitting diode (OLED) display, the isolating groove is formed at the barrier rib such that ink is prevented from crossing over the barrier rib and flowing into a neighboring pixel without a hydrophobic surface treatment of the barrier rib.

9 Claims, 6 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 22 Oct. 2010 and there duly assigned Serial No. 10-2010-0103550.

BACKGROUND OF THE INVENTION

1. Field of the Invention

The present invention relates generally to an organic light emitting diode (OLED) display. More particularly, the present invention relates to an OLED display which prevents ink from crossing over a barrier rib and flowing into a neighboring pixel without a hydrophobic surface treatment to the barrier rib.

2. Description of the Related Art

An organic light emitting diode (OLED) display includes two electrodes and an organic emission layer disposed between the two electrodes, and electrons injected from one electrode and holes injected from the other electrode are combined in the organic emission layer so that excitons are formed, and light is emitted by energy generated from the excitons.

Among them, the organic emission layer is formed by using a nozzle coating method or an inkjet printing method. In this case, a problem may be generated in that ink dripped to the pixel enclosed by a barrier rib through the inkjet printing method passes over the barrier rib and flows into a neighboring pixel. To prevent this problem, plasma treatment is performed on the surface of the barrier rib to provide hydrophobicity to the surface of the barrier rib. Accordingly, the hydrophilic ink does not pass over the barrier rib which has undergone the hydrophobic surface treatment.

However, when the barrier rib surface has hydrophobicity, the side portion of the barrier rib, as well as the upper portion of the barrier rib, has hydrophobicity so that the ink is not coated on the side portion of the barrier rib. As a result, the thickness is different between the edge of the pixel and the center thereof and, as a result, the surface of the pixel is not flat. Therefore, light leakage is generated at the edge of the pixel, and thereby the color reproducibility is decreased due to the difference of the color between the edge of the pixel and the center thereof.

The above information disclosed in this Background section is only for enhancement of an understanding of the background of the described technology, and therefore it may contain information which does not form the prior art which is already known in this country to a person of ordinary skill in the art.

SUMMARY OF THE INVENTION

The present invention provides an organic light emitting diode (OLED) display which prevents ink from crossing over a barrier rib and flowing into a neighboring pixel without a hydrophobic surface treatment to the barrier rib.

An organic light emitting diode (OLED) display according to an exemplary embodiment of the present invention may include a substrate; a first electrode formed on the substrate; a barrier rib formed on the substrate and having an opening exposing the first electrode; an organic emission layer formed on the first electrode; and a second electrode formed on the organic emission layer; wherein the barrier rib includes an isolating groove formed between organic emission layers of neighboring pixels.

The isolating groove may be formed by being depressed from the surface of the barrier rib, the isolating groove may have a step shape, and the side surface of the isolating groove may have undergone a hydrophilic surface treatment.

The isolating groove may penetrate from the surface of the barrier rib to the bottom surface, the isolating groove may have a step shape, and the side surface of the isolating groove may have undergone a hydrophilic surface treatment.

The organic emission layer may be formed at the opening of the barrier rib, the opening of the barrier rib may have a step shape, an assistance barrier rib positioned between the substrate and the barrier rib may be further included, and a portion of the assistance barrier rib may be exposed through the opening of the barrier rib.

The second electrode may be formed inside the isolating groove, or the second electrode may not be formed inside the isolating groove.

According to the present invention, the isolating groove is formed at the barrier rib so that ink may be prevented from crossing over the barrier rib and flowing into the neighboring pixel without a hydrophobic surface treatment of the barrier rib.

Also, a problem of non-uniformity of the thickness of the barrier rib, which may be generated in the case of the hydrophobic surface treatment, may be solved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
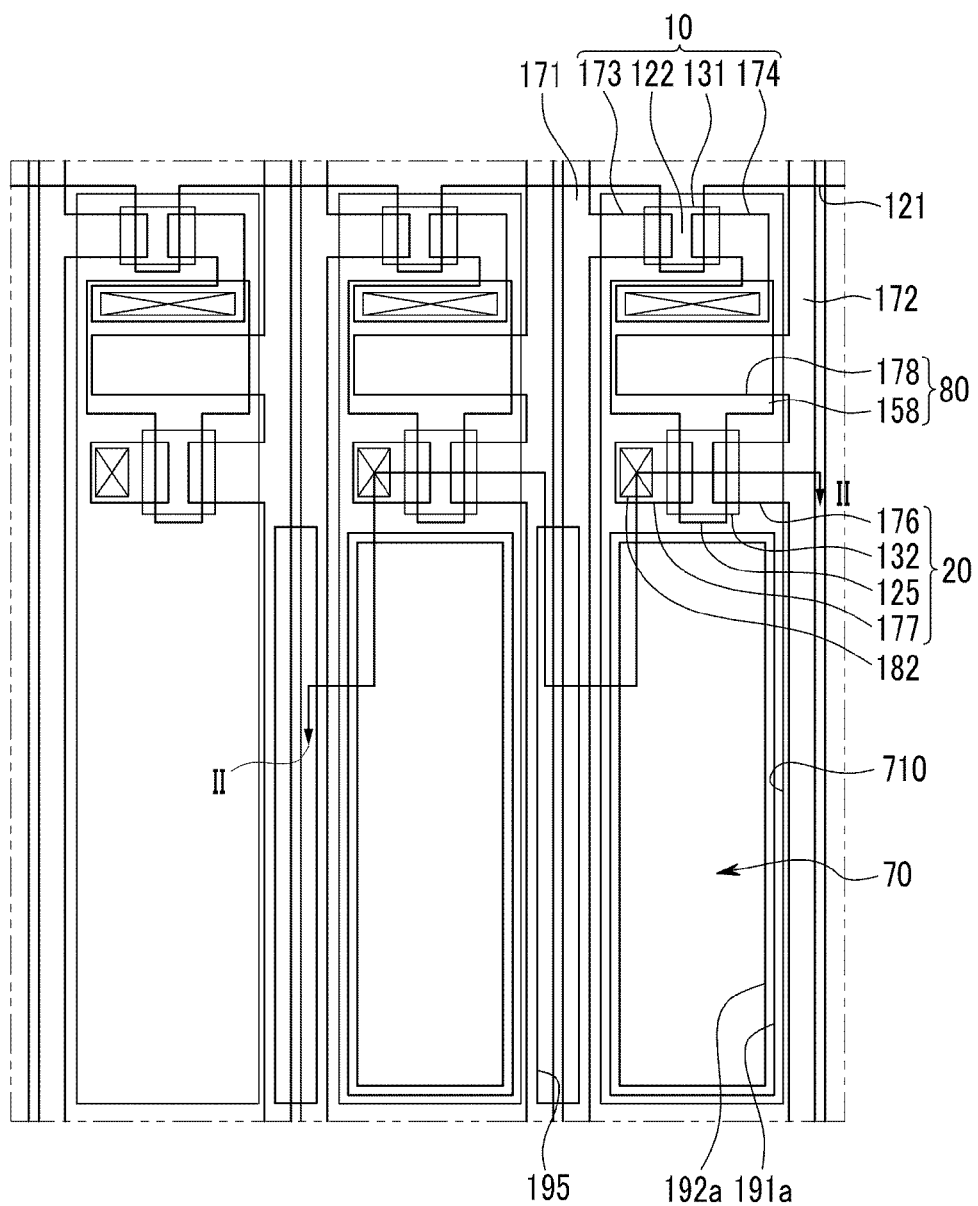
FIG. 1 is a layout view of three neighboring pixels in an organic light emitting diode (OLED) display according to a first exemplary embodiment of the present invention.

Hereinafter, the present invention will be described more fully with reference to the accompanying drawings, in which exemplary embodiments of the invention are shown. As those skilled in the art will realize, the described embodiments may be modified in various different ways, all without departing from the spirit or scope of the present invention.

Furthermore, in various exemplary embodiments, like reference numerals are used for components having the same configuration representatively in a first exemplary embodiment, and other configurations different from the first exemplary embodiment are described in the other exemplary embodiments.

In describing the present invention, parts that are not related to the description will be omitted. Like reference numerals designate like elements throughout the specification.

In addition, the size and thickness of each component shown in the drawings are arbitrarily shown for understanding and ease of description, but the present invention is not limited thereto.

In the drawings, the thickness of layers, films, panels, regions, etc. are exaggerated for clarity. In addition, in the drawings, for understanding and ease of description, the thicknesses of some layers and areas are exaggerated. It will be understood that, when an element such as a layer, film, region or substrate is referred to as being "on" another element, it can be directly on the other element or intervening elements may be present.

Thus, an organic light emitting diode (OLED) display according to the first exemplary embodiment will be described with reference to FIG. 1 and FIG. 2.

Figure 2:
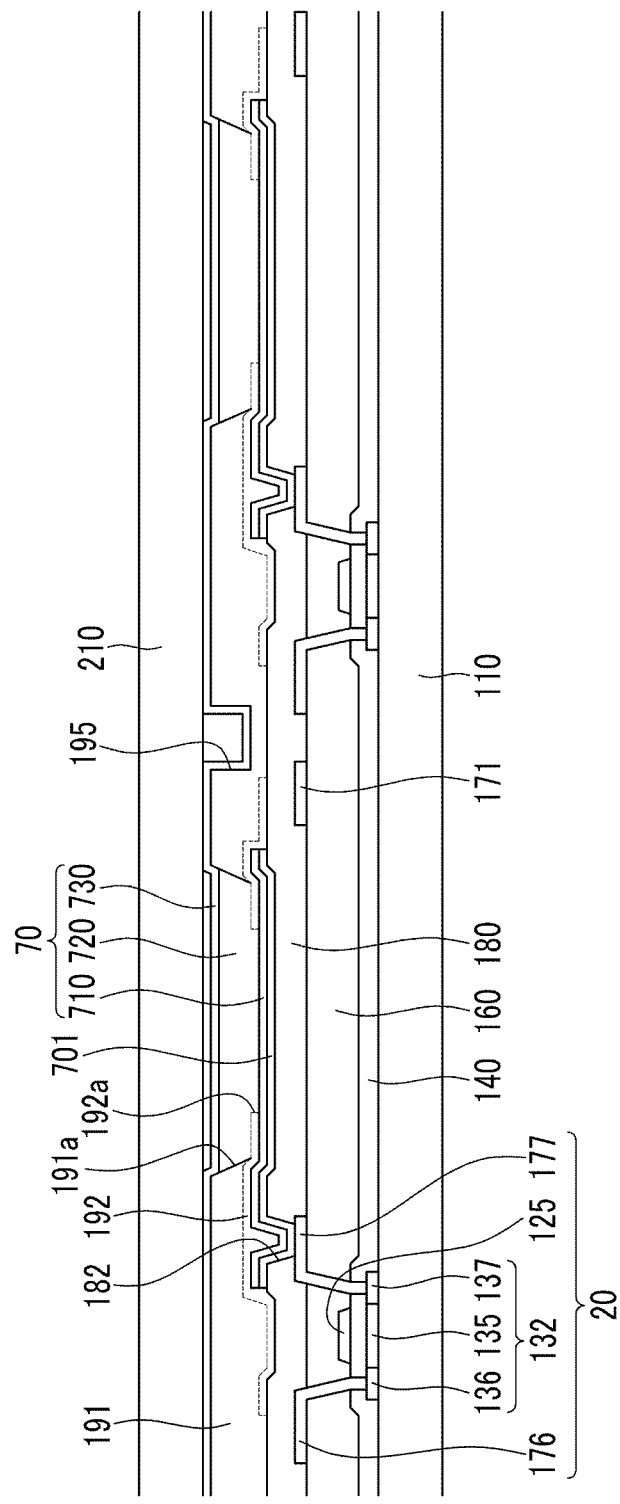
FIG. 2 is a cross-sectional view of the organic light emitting diode (OLED) display taken along the line II-II of FIG. 1.

FIG. 1 is a layout view of three neighboring pixels in an organic light emitting diode (OLED) display according to a first exemplary embodiment of the present invention, and FIG. 2 is a cross-sectional view of the organic light emitting diode (OLED) display taken along the line II-II of FIG. 1.

As shown in FIG. 1, an organic light emitting diode (OLED) display includes a switching thin film transistor 10, a driving thin film transistor 20, a storage capacitor 80, and an organic light emitting diode (OLED) 70 which are formed for each individual pixel. In addition, the organic light emitting diode (OLED) display further includes a gate line 121 disposed in one direction, and a data line 171 and a common voltage line 172 which cross the gate line 121 in an insulating manner. Herein, a boundary of one pixel may be defined by the gate line 121, the data line 171 and the common voltage line 172, but the invention is not necessarily limited thereto.

As shown in FIG. 2, the organic light emitting element 70 includes a first electrode 710, an organic emission layer 720 formed on the first electrode 710, and a second electrode 730 formed on the organic emission layer 720. Herein, the first electrode 710 is a positive (+) electrode which is a hole injection electrode, and the second electrode 730 is a negative (−) electrode which is an electron injection electrode. However, the first embodiment is not necessarily limited thereto. Therefore, the first electrode 710 may be the negative electrode and the second electrode 730 may be the positive electrode according to the driving method of the organic light emitting diode display. Holes and electrodes from each of the first electrode 710 and the second electrode 730 are injected into the organic emission layer 720. When excitons generated by combination of the injected holes and electrons are transitioned from an excited state to a ground state, light is emitted.

The storage capacitor 80 (FIG. 1) includes a first storage plate 158 and a second storage plate 178 with an interlayer insulating layer 160 (FIG. 2) interposed therebetween. Herein, the interlayer insulating layer 160 becomes a dielectric. Storage capacity is determined by electric charges stored in the storage capacitor 80 and a voltage between the storage plates 158 and 178.

The switching thin film transistor 10 (FIG. 1) includes a switching semiconductor layer 131, a switching gate electrode 122, a switching source electrode 173, and a switching drain electrode 174. The driving thin film transistor 20 (FIG. 1 and FIG. 2) includes a driving semiconductor layer 132, a driving gate electrode 125, a driving source electrode 176, and a driving drain electrode 177.

The switching thin film transistor 10 (FIG. 1) is used as a switching element for selecting a pixel to emit light. The switching gate electrode 122 is connected to the gate line 121. The switching source electrode 173 is connected to the data line 171. The switching drain electrode 174 is spaced apart from the switching source electrode 173 and is connected to the first storage plate 158.

The driving thin film transistor 20 (FIG. 1 and FIG. 2) applies driving power for allowing the organic emission layer 720 of the organic light emitting diode 70 in a selected pixel to emit light to the pixel electrode 710. The driving gate electrode 125 is connected to the first storage plate 158. Each of the driving source electrode 176 and the second storage plate 178 is connected to the common voltage line 172. The driving drain electrode 177 is connected to the first electrode 710 of the organic light emitting diode 70 through an electrode contact hole 182.

In this structure, the switching thin film transistor 10 is operated by a gate voltage applied to the gate line 121 so as to transmit a data voltage applied to the data line 171 to the driving thin film transistor 20. A voltage equivalent to the difference between a common voltage applied to the driving thin film transistor 20 from the common voltage line 172 and the data voltage transmitted from the switching thin film transistor 10 is stored in the storage capacitor 80, and a current corresponding to the voltage stored in the storage capacitor 80 flows to the organic light emitting diode 70 through the driving thin film transistor 20 so as to allow the organic light emitting diode 70 to emit light.

Hereinafter, the structure of the organic light emitting diode display according to the first embodiment will be described in detail with reference to FIG. 2.

Furthermore, the structure of the thin film transistor 10 will now be described by focusing on the driving thin film transistor 20. In addition, only the difference between the switching thin film transistor 10 and the driving thin film transistor 20 will be described.

The driving semiconductor layer 132 is formed on a substrate 110. The substrate 110 is made of an insulating material, such as glass, quartz, ceramic and plastic. However, the present invention is not limited thereto. Accordingly, the first substrate member 110 may be formed of a metallic material such as stainless steel, or the like.

The driving semiconductor layer 132 is made of a polycrystalline silicon film. Furthermore, the driving semiconductor layer 132 includes a channel region 135 which is not doped with impurities, and a source region 136 and a drain region 137 which are doped with p+impurities at both sides of the channel region 135. The doped ion material is a P-type impurity such as boron, and $B_2H_6$ is generally used as the P-type impurity. Herein, the impurity depends on the kind of thin film transistor.

In the first embodiment, a PMOS-structure thin film transistor using the P-type impurity has been used as the driving thin film transistor 20, but the driving thin film transistor is not limited thereto. Therefore, either an NMOS-structure thin film transistor or a CMOS-structure thin film transistor may be used as the driving thin film transistor 20.

Furthermore, the driving thin film transistor 20 shown in FIG. 2 is a polycrystalline thin film transistor including a polycrystalline silicon film, but the switching thin film transistor 10 not shown in FIG. 2 may be a polycrystalline thin film transistor or an amorphous thin film transistor including an amorphous silicon film.

A gate insulating layer 140, which is made of silicon nitride (SiNx) or silicon oxide (SiO$_2$), is formed on the driving semiconductor layer 132. A gate wire, including the driving gate electrode 125, is formed on the gate insulating layer 140. The gate wire further includes the gate line 121, the first storage plate 158, and other wires. In addition, the driving gate electrode 125 overlaps at least a part of the driving semiconductor layer 132, in particular, at the channel region 135.

The interlayer insulating layer 160 covering the driving gate electrode 125 is formed on the gate insulating layer 140. The gate insulating layer 140 and the interlayer insulating layer 160 share through-holes for exposing the source region 136 and the drain region 137 of the driving semiconductor layer 132. The interlayer insulating layer 160 is made of a ceramic-based material such as silicon nitride (SiN$_x$) or silicon oxide (SiO$_2$), like the gate insulating layer 140.

On the interlayer insulating layer 160, the data wire which includes the driving source electrode 176 and driving drain electrode 177 is formed. The data wire further includes the data line 171, the common power line 172, the second capacitor plate 178, and another wire. In addition, the driving source electrode 176 and driving drain electrode 177 are connected to the source region 136 and drain region 137, respectively, of the driving semiconductor layer 132 through through-holes which are formed in the interlayer insulating layer 160 and gate insulating layer 140.

As described above, the driving thin film transistor 20, which includes the driving semiconductor layer 132, driving gate electrode 125, driving source electrode 176 and driving drain electrode 177, is formed. The constitution of the driving thin film transistor 20 is not limited to the above examples, but may be variously modified with known constitutions as can be easily performed by those who are skilled in the art.

On the interlayer insulating layer 160, a planarization layer 180 which covers the data wires 172, 176, 177 and 178 is formed. The planarization layer 180 eliminates a step and performs planarization in order to increase the luminous efficiency of the organic light emitting diode 70 to be formed thereon. In addition, the planarization layer 180 has an electrode contact hole 182 which exposes a portion of the drain electrode 177 formed therein.

The planarization layer 180 may be made of at least one material selected from acryl resins (polyacrylate resin), epoxy resins, phenolic resins, polyamide resins, polyimides resins, unsaturated polyester resins, polyphenylenether resins, polyphenylene sulfide resins, and benzocyclobutene (BCB).

In addition, the first exemplary embodiment according to the present invention is not limited to the above structures but, if necessary, any one of the planarization layer 180 and the interlayer insulating layer 160 may be omitted.

On the planarization layer 180, the first electrode 710 of the organic light emitting diode 70 is formed. That is, the organic light emitting diode (OLED) display includes a plurality of first electrodes 710 which are disposed for a plurality of pixels. At this point, a plurality of the first electrodes 710 are separated from each other. The first electrode 710 is connected to the drain electrode 177 through the electrode contact hole 182 of the planarization layer 180.

In addition, on the planarization layer 180, a barrier rib 191 which has an opening 191a which exposes the first electrode 710 is formed. That is, the barrier rib 191 has a plurality of openings 191a which are individually formed for each pixel. In addition, the first electrode 710 is disposed so as to correspond to the opening of the barrier rib 191. However, the first electrode 710 is not necessarily disposed only on the opening 191a, but a portion of the first electrode 710 may be disposed under the barrier rib 191 so as to overlap the barrier rib 191. The barrier rib 191 may be made of a resin such as a polyacrylate resin and polyimides or silica-based inorganic materials.

An assistance barrier rib 192 is formed between the planarization layer 180 and the barrier rib 191. A portion 192a of the assistance barrier rib 192 is exposed through the opening 191a of the barrier rib 191. Accordingly, the opening 191a of the barrier rib 191 has a step shape.

An isolating groove 195 having a predetermined depth is formed in the barrier rib 191 positioned between the pixels. The isolating groove 195 is depressed from the surface of the barrier rib 191. The organic emission layer 720 is formed on the first electrode 710, and the second electrode 730 is formed on the organic emission layer 720. As described above, the organic light emitting element 70, including the first electrode 710, the organic emission layer 720 and the second electrode 730, is formed. The second electrode 730 is also formed inside the isolating groove 195.

The organic emission layer 720 is made of a low molecular weight organic material or a high molecular weight organic material such as poly3,4-ethylenedioxythiophene (PEDOT).

Also, the organic emission layer 720 can be formed with multiple layers, including at least one of an emission layer, a hole injection layer (HIL), a hole transport layer (HTL), an electron transport layer (ETL) and an electron injection layer (EIL). When all layers are included, the hole injection layer (HIL) is disposed on the pixel electrode 710, an anode, and then the hole transport layer (HTL), the emission layer, the electron transport layer (ETL), and the electron injection layer (EIL) are sequentially stored thereon.

The organic emission layer 720 is formed by dripping ink made of a high molecular weight organic material of a liquid phase into the opening 191a of the barrier rib 191. This ink is the liquid phase such that a difference of thickness is generated between the edge portion and the center portion of the ink dripped into the opening 191a by surface tension, and thereby the thickness of the organic emission layer 720 may not be uniform. However, in the first exemplary embodiment, the assistance barrier rib 192 is formed between the planarization layer 180 and the barrier rib 191 so as to form the side surface of the step shape at the opening 191a of the barrier rib 191 such that the thickness of the edge portion of the ink may be equal to the thickness of the center portion of the ink. Accordingly, the thickness of the organic emission layer 720 is uniform.

Also, the ink in the liquid phase may cross over the barrier rib 191 and flow into the neighboring pixel. However, in the first exemplary embodiment, the isolating groove 195 is formed on the barrier rib 191 positioned between the pixels such that the ink does not flow into the neighboring pixel.

Also, a hydrophilic surface treatment is provided to the side surface of the isolating groove 195 in order that the hydrophilic ink easily contact the isolating groove 195. In the hydrophilic surface treatment, a hydrophilic high molecular material is formed on the side surface of the isolating groove 195 through a plasma treatment.

Accordingly, the ink flowing into the isolating groove 195 may be prevented from flowing into the neighboring pixel, and thereby the barrier effect is increased.

Also, in the first exemplary embodiment, the problem of non-uniformity of the thickness of the organic emission layer 720 may be solved. Non-uniformity of the thickness is generated in the case where the barrier rib surface undergoes the hydrophobic surface treatment so that the hydrophilic ink does not cross over the barrier rib 191.

The first electrode 710 and the second electrode 730 are formed of a transparent conductive material, and a reflective layer 701 made of a reflective material is formed between the planarization layer 180 and the first electrode 710. Accordingly, a top emission organic light emitting diode (OLED) display is formed.

For the transparent conductive material, a material such as ITO (indium tin oxide), IZO (indium zinc oxide), ZnO (zinc oxide), or $In_2O_3$ (indium oxide) may be used. For the reflective material and semitransparent material, a material such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used.

On the second electrode 730, an encapsulation member 210 faces the display substrate 110. The encapsulation member 210 is made of a transparent material such as glass or plastic.

In the first exemplary embodiment, the isolating groove 195 is formed on the barrier rib 191 so as to prevent the ink from crossing over the barrier rib and flowing into the neighboring pixel. However, the isolating groove may be formed with a step shape so as to further increase the barrier effect.

Figure 3:
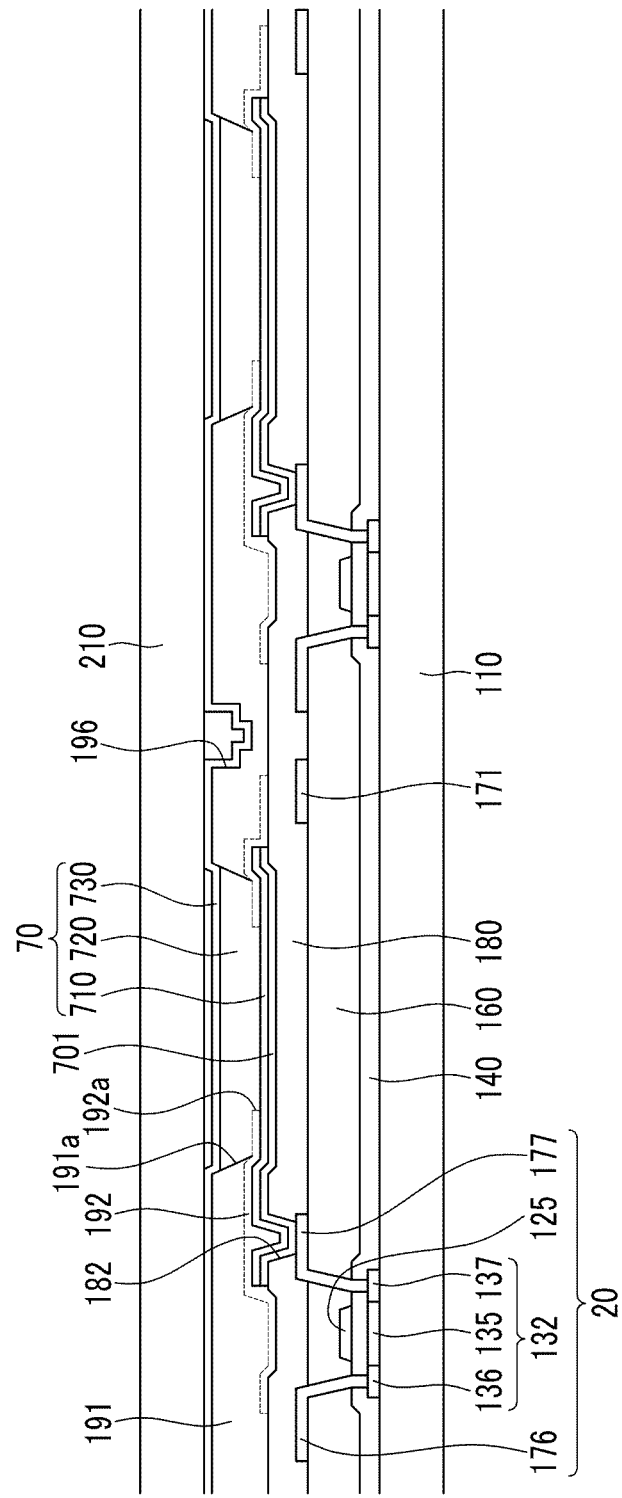
FIG. 3 is a cross-sectional view of an organic light emitting diode (OLED) display according to a second exemplary embodiment of the present invention.

FIG. 3 is a cross-sectional view of an organic light emitting diode (OLED) display according to a second exemplary embodiment of the present invention.

Except for the isolating groove of the step shape, the second exemplary embodiment of FIG. 3 is substantially equivalent to the first exemplary embodiment shown in FIG. 1 and FIG. 2, and thus repetitive description is omitted.

As shown in FIG. 3, in the organic light emitting diode (OLED) display according to the second exemplary embodiment, a driving semiconductor layer 132 is formed on the substrate 110. The driving semiconductor layer 132 includes a channel region 135 in which an impurity is not doped, and a source region 136 and a drain region 137 which are doped with p+ impurities at both ends of the channel region 135. On the driving semiconductor layer 132, a gate insulating layer 140 is formed of silicon nitride ($SiN_x$) or silicon oxide $SiO_2$. On the gate insulating layer 140, the gate wire which includes the driving gate electrode 125 is formed. The gate wire further includes a gate line 121, the first capacitor plate 158, and another wire. Furthermore, the driving gate electrode 125 is formed so as to overlap at least a portion of the driving semiconductor layer 132, particularly the channel region 135.

On the gate insulating layer 140, the interlayer insulating layer 160 which covers the driving gate electrode 125 is formed. The gate insulating layer 140 and the interlayer insulating layer 160 have through-holes which expose the source region 136 and drain region 137 of the driving semiconductor layer 132. On the interlayer insulating layer 160, the data wire which includes the driving source electrode 176 and driving drain electrode 177 is formed. The data wire further includes a data line 171, the common power line 172, the second capacitor plate 178, and another wire. In addition, the driving source electrode 176 and driving drain electrode 177 are connected to the source region 136 and drain region 137, respectively, of the driving semiconductor layer 132 through through-holes which are formed on the interlayer insulating layer 160 and gate insulating layer 140.

As described above, the driving thin film transistor 20 which includes the driving semiconductor layer 132, driving gate electrode 125, driving source electrode 176, and driving drain electrode 177 is formed. On the interlayer insulating layer 160, the planarization layer 180 which covers the data wires 172, 176, 177, and 178 is formed. The planarization layer 180 has an electrode contact hole 182 which exposes a portion of the drain electrode 177.

On the planarization layer 180, the first electrode 710 of the organic light emitting diode 70 is formed. The first electrode 710 is connected to the drain electrode 177 through the electrode contact hole 182 of the planarization layer 180.

A barrier rib 191, having an opening 191a exposing the first electrode 710, is formed on the planarization layer 180. That is, the barrier rib 191 has a plurality of openings 191a which are individually formed for each pixel. In addition, the first electrode 710 is disposed so as to correspond to the opening 191a of the barrier rib 191. The assistance barrier rib 192 is formed between the planarization layer 180 and the barrier rib 191. A portion 192a of the assistance barrier rib 192 is exposed through the opening 191a of the barrier rib 191. Accordingly, the opening 191a of the barrier rib 191 has a step shape.

The isolating groove 196 of the step shape is formed at the barrier rib 191 positioned between the pixels.

An organic emission layer 720 is formed on the first electrode 710, and the second electrode 730 is formed on the organic emission layer 720. As described above, an organic light emitting element 70, including the first electrode 710, the organic emission layer 720 and the second electrode 730, is formed.

The organic emission layer 720 is formed by dripping ink made of a high molecular weight organic material of a liquid phase into the opening 191a of the barrier rib 191. The ink is a liquid phase such that the ink may cross over the barrier rib 191 and may flow into the neighboring pixel. However, in the second exemplary embodiment, the isolating groove 196 of a step shape is formed on the barrier rib 191 positioned between the pixels such that an area wherein the isolating groove 196 of the step shape is capable of contacting the ink is formed. Accordingly, the contact resistance with the ink is increased such that the ink flowing into the neighboring pixel may be further easily prevented.

Also, a hydrophilic surface treatment is provided to the side surface of the isolating groove 196 so that the hydrophilic ink easily contacts the isolating groove 196. Accordingly, the ink flowing into the isolating groove 196 may be prevented from flowing into the neighboring pixel, and thereby the barrier effect is increased.

On the other hand, the isolating groove 195 which is depressed from the surface of the barrier rib 191 is formed in the first exemplary embodiment so as to prevent the ink from crossing over the barrier rib and flowing into the neighboring pixel. However, the isolating groove penetrating from the surface of the barrier rib 191 to the bottom surface may be formed.

Figure 4:
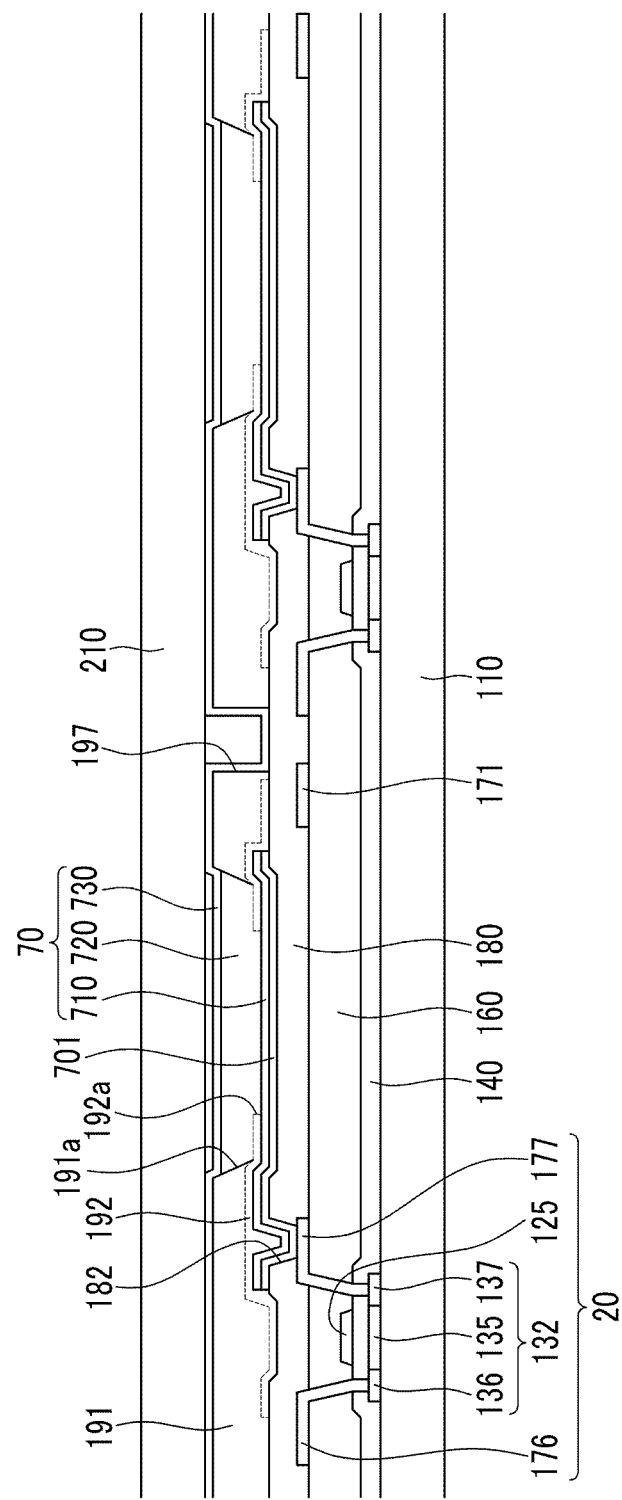
FIG. 4 is a cross-sectional view of an organic light emitting diode (OLED) display according to a third exemplary embodiment of the present invention.

FIG. 4 is a cross-sectional view of an organic light emitting diode (OLED) display according to a third exemplary embodiment of the present invention.

Except for the isolating groove penetrating from the surface of the barrier rib 191 to the bottom surface, the third exemplary embodiment of FIG. 4 is substantially equivalent to the first exemplary embodiment shown in FIG. 1 and FIG. 2 so that repetitive description is omitted.

As shown in FIG. 4, the organic light emitting diode (OLED) display according to the third exemplary embodiment includes a barrier rib 191 having an opening 191a exposing the first electrode 710 and formed on the planarization layer 180. That is, the barrier rib 191 has a plurality of openings 191a which are individually formed for each pixel. In addition, the first electrode 710 is disposed so as to correspond to the opening of the barrier rib 191. An isolating groove 197 exposing a portion of the planarization layer 180 is formed on the barrier rib 191 positioned between the pixels.

The isolating groove 197 penetrates from the top surface of the barrier rib 191 to the bottom surface.

The isolating groove 197 prevents the ink dripped into the opening 191a of the barrier rib 191 from crossing over the barrier rib 191 and flowing into the neighboring pixel. The depth of the isolating groove 197 is greater than that of the isolating groove 195 of the first exemplary embodiment so that the effect of preventing the ink from crossing over the barrier rib 191 and flowing into the neighboring pixel is excellent.

Also, a hydrophilic surface treatment is provided to the side surface of the isolating groove 197 so that the hydrophilic ink easily contacts the isolating groove 197. Accordingly, the barrier effect of the ink is further improved.

In the third exemplary embodiment, the isolating groove 197 penetrating from the surface of the barrier rib 191 to the bottom surface is formed so as to prevent the ink from crossing over the barrier rib and flowing into the neighboring pixel. However, the isolating groove may be formed with a step shape so as to further increase the barrier effect.

Figure 5:
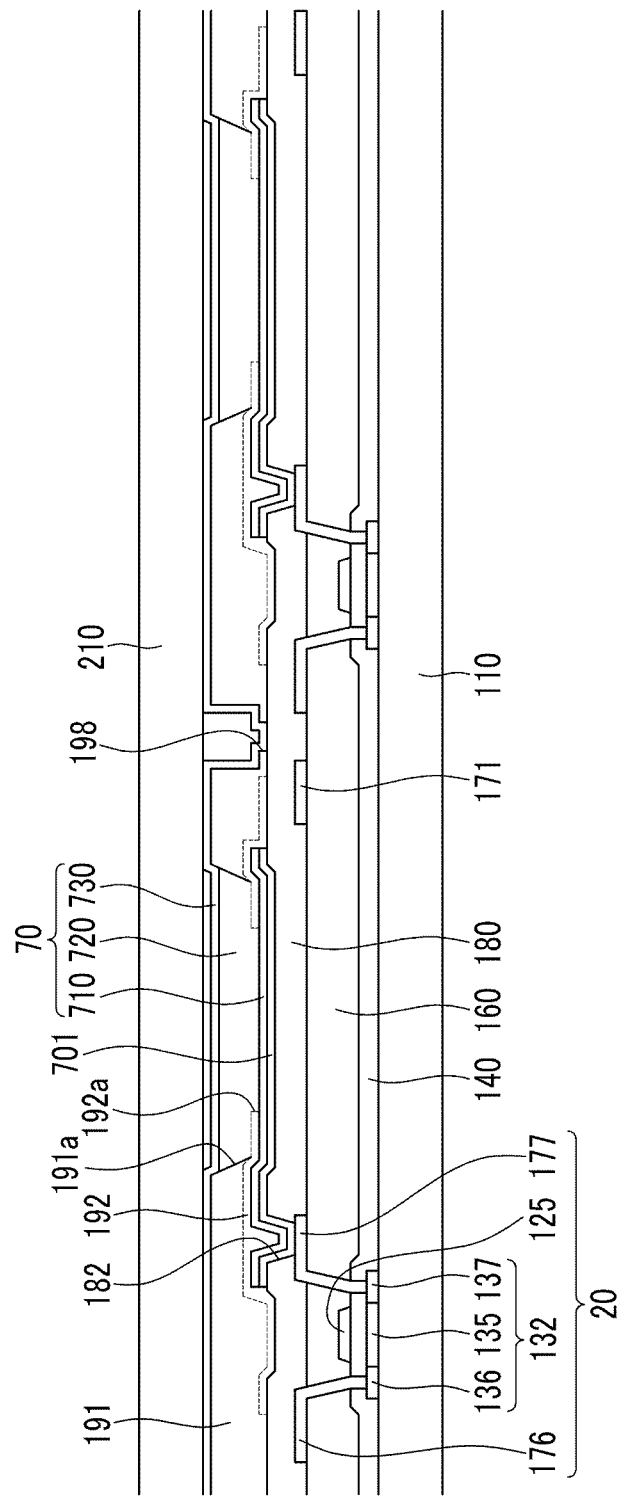
FIG. 5 is a cross-sectional view of an organic light emitting diode (OLED) display according to a fourth exemplary embodiment of the present invention.

FIG. 5 is a cross-sectional view of an organic light emitting diode (OLED) display according to a fourth exemplary embodiment of the present invention.

Except for the isolating groove of the step shape, the fourth exemplary embodiment of FIG. 5 is substantially equivalent to the third exemplary embodiment shown in FIG. 4 such that repetitive description is omitted.

As shown in FIG. 5, in the organic light emitting diode (OLED) display of the fourth exemplary embodiment, a barrier rib 191 having an opening 191a exposing the first electrode 710 is formed on the planarization layer 180. That is, the barrier rib 191 has a plurality of openings 191a which are individually formed for each pixel. In addition, the first electrode 710 is disposed so as to correspond to the opening of the barrier rib 191. An isolating groove 198 exposing a portion of the planarization layer 180, and having a step shape, is formed on the barrier rib 191 positioned between the pixels.

The isolating groove 198 of the step shape prevents the ink dripped into the opening 191a of the barrier rib 191 from crossing over the barrier rib 191 and flowing into the neighboring pixel. The isolating groove 198 of the step shape increases the area capable of contacting the ink such that the contact resistance with the ink may be increased, and thereby the ink may be easily prevented from crossing over the barrier rib 191 and flowing into the neighboring pixel.

The hydrophilic surface treatment is provided to the side surface of the isolating groove 198 of the step shape such that the hydrophilic ink may easily contact the isolating groove 198 of the step shape. Accordingly, the ink which has flowed into the isolating groove 198 of the step shape may not flow into the pixel, thereby increasing the barrier effect.

On the other hand, whereas the second electrode is formed inside the isolating groove in the above exemplary embodiment, the second electrode may not be formed inside the isolating groove in the fourth exemplary embodioment.

Figure 6:
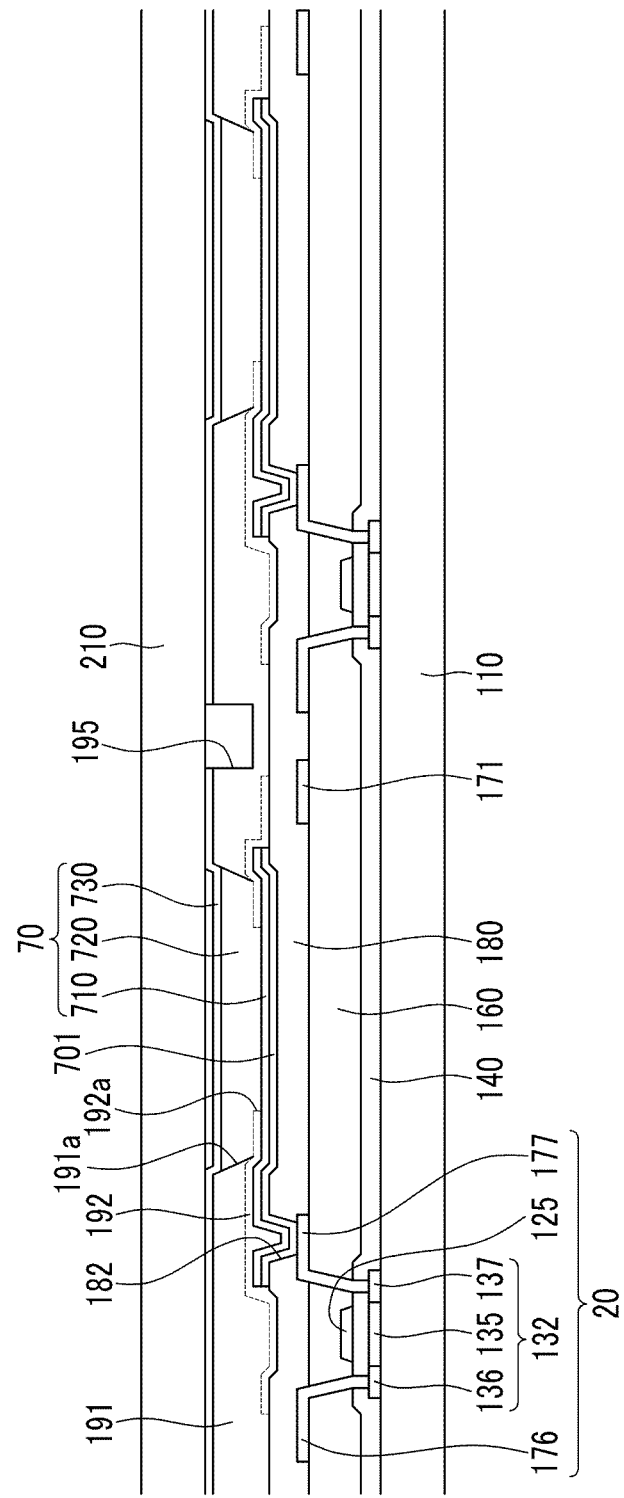
FIG. 6 is a cross-sectional view of an organic light emitting diode (OLED) display according to a fifth exemplary embodiment of the present invention.

FIG. 6 is a cross-sectional view of an organic light emitting diode (OLED) display according to a fifth exemplary embodiment of the present invention.

Except for the second electrode which is not formed inside the isolating groove, the fifth exemplary embodiment of FIG. 6 is substantially equivalent to the first exemplary embodiment shown in FIG. 1 and FIG. 2 such that repetitive description is omitted.

As shown in FIG. 6, in the organic light emitting diode (OLED) display of the fifth exemplary embodiment, the second electrode 730 is formed on the organic emission layer 720 and the barrier rib 191. However, the second electrode 730 is not formed inside the isolating groove 195.

In the present exemplary embodiment, one switching thin film transistor and one driving thin film transistor are described, but at least one thin film transistor and a plurality of signal lines may be additionally added.

While this disclosure has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. An organic light emitting diode (OLED) display, comprising:
   a substrate;
   a first electrode formed on the substrate;
   a barrier rib formed on the substrate and having an opening exposing the first electrode;
   an organic emission layer formed on the first electrode; and
   a second electrode formed on the organic emission layer;
   wherein the barrier rib includes an isolating groove formed between the organic emission layer and organic emission layers of neighboring pixels, said isolating groove has a dual step shape that is a depression in the barrier rib, said isolating groove comprising:
   a first rectangular step structure having two sides walls attached to a bottom wall at 90 degree angles; and
   a second rectangular step structure having two sides walls attached to a bottom wall at 90 degree angles, said second rectangular step structure is disposed as an indentation in the bottom wall of the first rectangular step structure.

2. The organic light emitting diode (OLED) display of claim 1, wherein a side surface of the isolating groove undergoes a hydrophilic surface treatment.

3. The organic light emitting diode (OLED) display of claim 1, wherein the isolating groove penetrates from a top surface of the barrier rib to a bottom surface of the barrier rib.

4. The organic light emitting diode (OLED) display of claim 3, wherein a side surface of the isolating groove undergoes a hydrophilic surface treatment.

5. The organic light emitting diode (OLED) display of claim 1, wherein the organic emission layer is formed at the opening of the barrier rib.

6. The organic light emitting diode (OLED) display of claim 5, wherein the opening of the barrier rib has a step shape.

7. The organic light emitting diode (OLED) display of claim 6, further comprising an assistance barrier rib positioned between the substrate and the barrier rib, wherein a portion of the assistance barrier rib is exposed through the opening of the barrier rib.

8. The organic light emitting diode (OLED) display of claim 1, wherein the second electrode is formed inside the isolating groove.

9. The organic light emitting diode (OLED) display of claim 1, wherein the second electrode is not formed inside the isolating groove.

* * * * *